US007135121B2

(12) United States Patent
Matsuzawa et al.

(10) Patent No.: US 7,135,121 B2
(45) Date of Patent: Nov. 14, 2006

(54) INK-JET RECORDING HEAD, MANUFACTURING METHOD OF THE SAME AND INK-JET RECORDING APPARATUS

(75) Inventors: Akira Matsuzawa, Nagano-ken (JP); Masato Shimada, Nagano-ken (JP); Tetsushi Takahashi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 183 days.

(21) Appl. No.: 10/754,712

(22) Filed: Jan. 12, 2004

(65) Prior Publication Data

US 2004/0141032 A1 Jul. 22, 2004

Related U.S. Application Data

(62) Division of application No. 09/756,292, filed on Jan. 9, 2001, now Pat. No. 6,712,456.

(30) Foreign Application Priority Data

| | | | |
|---|---|---|---|
| Jan. 17, 2000 | (JP) | ............................. | 2000-007651 |
| Jan. 28, 2000 | (JP) | ............................. | 2000-020245 |
| Jul. 28, 2000 | (JP) | ............................. | 2000-229343 |
| Oct. 31, 2000 | (JP) | ............................. | 2000-332557 |

(51) Int. Cl.
*B41J 2/04* (2006.01)
*H01L 21/00* (2006.01)

(52) U.S. Cl. ............................ 216/27; 216/41; 216/83; 438/21; 29/890.1; 347/55; 347/68; 347/70

(58) Field of Classification Search .................. 216/27, 216/41, 83; 29/890.1; 438/21; 347/55, 347/68, 70
See application file for complete search history.

(56) References Cited

U.S. PATENT DOCUMENTS

| | | | |
|---|---|---|---|
| 4,937,597 A * | 6/1990 | Yasuhara et al. | 347/71 |
| 6,254,223 B1 * | 7/2001 | Kim et al. | 347/70 |
| 6,401,316 B1 * | 6/2002 | Kishima | 29/25.35 |
| 6,502,930 B1 * | 1/2003 | Shimada et al. | 347/71 |
| 6,584,708 B1 * | 7/2003 | Yun et al. | 310/324 |
| 6,851,187 B1 * | 2/2005 | Kishima | 29/890.1 |
| 2003/0011660 A1 * | 1/2003 | Nishi et al. | 347/68 |

FOREIGN PATENT DOCUMENTS

| | | |
|---|---|---|
| EP | 0 782 923 A1 | 7/1997 |
| EP | 0 830 945 A1 | 3/1998 |
| EP | 0 919 383 A2 | 6/1999 |
| EP | 919383 | 6/1999 |
| EP | 0 963 846 A2 | 12/1999 |
| EP | 963846 | 12/1999 |

(Continued)

*Primary Examiner*—Shamim Ahmed
(74) *Attorney, Agent, or Firm*—Sughrue Mion, PLLC

(57) ABSTRACT

A manufacturing method of an ink-jet recording head for improving relative positional accuracy between a piezoelectric element and a pressure generating chamber to improve ink ejection characteristics and stability thereof. The manufacturing method includes the steps of: forming a passage-forming layer on a passage-forming substrate and imparting etching selectivity to a region that will be a space portion of the passage-forming layer; forming a vibration plate on the passage-forming layer and a piezoelectric element; performing anisotropic etching on the passage-forming substrate to form a penetrated portion at least to a region that will be the space portion, etching the passage-forming layer to form the space portion, and forming a pressure generating chamber opposite the space portion; and joining a nozzle plate to the passage-forming substrate.

4 Claims, 15 Drawing Sheets

FOREIGN PATENT DOCUMENTS

| | | | |
|---|---|---|---|
| JP | 59098859 | | 6/1984 |
| JP | 3-293141 | A | 12/1991 |
| JP | 5-286131 | | 2/1993 |
| JP | 7-318417 | A | 12/1995 |
| JP | 8-298318 | A | 11/1996 |
| JP | 09156097 | A | 6/1997 |
| JP | 10286960 | A | 10/1998 |
| JP | 10337875 | A | 12/1998 |
| JP | 11227190 | A | 8/1999 |
| JP | 11291495 | A | 10/1999 |
| WO | WO 97/34769 | A1 | 9/1997 |

* cited by examiner

FIG. 2A
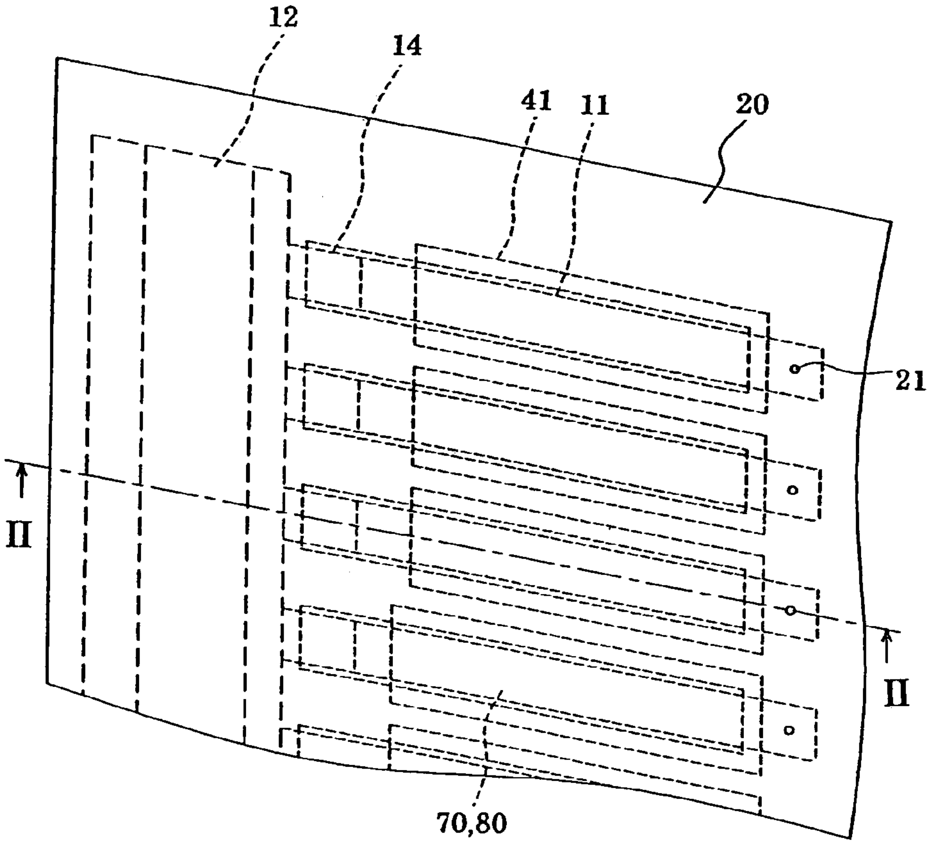
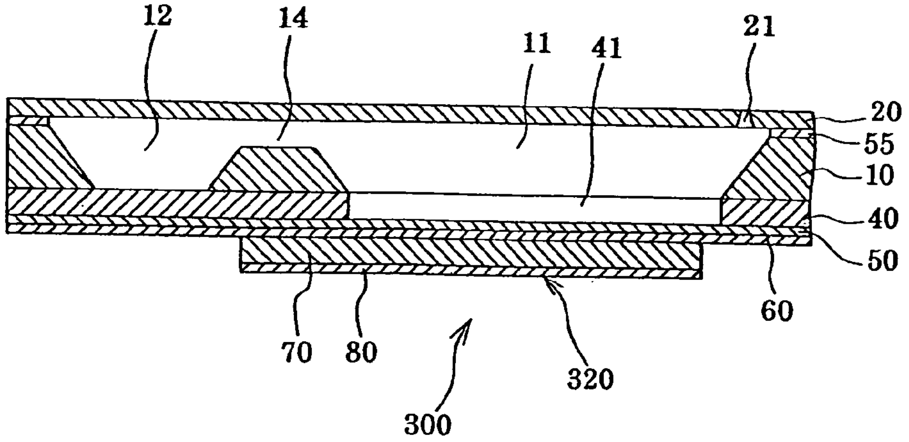
FIG. 2B

INK-JET RECORDING HEAD, MANUFACTURING METHOD OF THE SAME AND INK-JET RECORDING APPARATUS

This is a divisional of application Ser. No. 09/756,292 filed Jan. 9, 2001, and now U.S. Pat. No. 6,712,456, the disclosure of which is incorporated herein by reference.

BACKGROUND OF THE INVENTION

The present invention relates to an ink-jet recording head, in which a piezoelectric element is formed via a vibration plate in a portion of a pressure generating chamber communicating with a nozzle orifice that ejects ink droplets, and ink droplets are ejected by displacement of the piezoelectric element. Furthermore, the present invention relates to a manufacturing method of the same and an ink-jet recording apparatus.

Two types of recording heads are put into practical use with regard to the ink-jet recording head, in which a portion of a pressure generating chamber communicating with a nozzle orifice that ejects ink droplets is constituted of a vibration plate, and the vibration plate is deformed by a piezoelectric element to pressurize ink in the pressure generating chamber, thus ink droplets are ejected from the nozzle orifice. One is a recording head using a piezoelectric actuator of longitudinal vibration mode that expands and contracts in the axis direction of the piezoelectric element, and the other one uses a piezoelectric actuator of flexural vibration mode.

The former can change volume of the pressure generating chamber by abutting an end surface of the piezoelectric element against the vibration plate, and manufacturing of a head suitable to high density printing is enabled. On the contrary, a difficult process in which the piezoelectric element is cut and divided in a comb teeth shape to make it coincide with the array pitch of the nozzle orifice and a method so that the cut and divided piezoelectric element is aligned and fixed to the pressure generating chamber is necessary, thus there is a problem of a complex manufacturing process.

On the other hand, in the latter, the piezoelectric element can be fabricated and installed on a vibration plate by a relatively simple process in which a green sheet, which is piezoelectric material, is adhered while fitting the shape thereof to the pressure generating chamber shape and is sintered. However, a certain size of vibration plate is required due to the usage of flexural vibration, thus there is a problem that high density array of the piezoelectric elements is difficult.

In order to solve the disadvantage of the latter recording head, as shown in Japanese Patent Laid-Open No. Hei 5-286131, a recording head is proposed, in which an even piezoelectric material layer is formed across the entire surface of the vibration plate by a deposition technology, the piezoelectric material layer is cut and divided into a shape corresponding to the pressure generating chamber by a lithography method, and the piezoelectric element is formed so as to be independent of another piezoelectric element for each pressure generating chamber.

According to the above-described process, a work for adhering the piezoelectric element on the vibration plate is unnecessary, and there is an advantage that not only the piezoelectric element can be fabricated and installed by accurate and simple means, lithography method, but also the thickness of the piezoelectric element can be made thin and a high-speed drive is enabled.

In such an ink-jet printing head, in general, the pressure generating chamber is formed so as to penetrate in the thickness direction of the plate by performing etching for the plate by use of a specified mask pattern from the plate surface opposite that having the piezoelectric element made thereon.

However, in such an ink-jet recording head, an error sometimes occurs in aligning the mask pattern for forming the piezoelectric element and the mask pattern for forming the pressure generating chamber, alternatively slippage of light exposure sometimes occurs due to a warp or the like of the plate where the pressure generating chamber is formed. Therefore, there is a problem that the relative positional accuracy between the piezoelectric element and the pressure generating chamber is lowered.

Moreover, in the case, for example, where a single crystal silicon substrate of a plane (110) of the plane orientation is employed as a plate, a position of the pressure generating chamber, the position being close to the vibration plate, is not stable due to variation of the vertical degree of a plane (111) thereof. Therefore, the relative positional accuracy between the piezoelectric element and the pressure generating chamber is lowered, thus causing problems of low ink ejection characteristics and low stability thereof.

Furthermore, in the case where the pressure generating chambers are arrayed in a high density, the thickness of compartment walls between the pressure generating chambers is made thin which results in lack of rigidity of the compartment walls, thus causing the problem that cross talk occurs among the pressure generating chambers.

For example, in the piezoelectric actuator of longitudinal vibration mode, a structure is conceived, in which a wide width portion is provided in a portion of the pressure generating chamber, the portion being dose to the vibration plate, and the width of portions of the pressure generating chamber other than the wide width portion is made narrow to thicken the corresponding compartment wall portions. However, in this case, an operation such as processing and pasting for the wide width portion of the pressure generating chamber is required, thus causing problems on operationality and accuracy.

SUMMARY OF THE INVENTION

In consideration of the foregoing circumstances, the object of the present invention is to provide an ink-jet recording head, in which the relative positional accuracy between the piezoelectric element and the pressure generating chamber is improved to make ink ejection characteristics and stability thereof improved, and the pressure generating chambers can be arrayed in a high density and further, cross talk between the pressure generating chambers can be reduced. Moreover, the object of the present invention is to provide a manufacturing method of the ink-jet recording head and an ink-jet recording apparatus.

A first aspect of the present invention for solving the above-described problems is an ink-jet recording head that comprises: a passage-forming substrate having a pressure generating chamber formed thereon, which communicates with a nozzle orifice; and a piezoelectric element formed of a thin film and by a lithography method via a vibration plate constituting a portion of the pressure generating chamber in a region corresponding to the pressure generating chamber. The ink-jet recording head is characterized in that the space portion communicating with the pressure generating chamber and having at least one surface constituted of the vibration plate is provided in a region opposite to the pressure generating chamber, which is between the passage-forming substrate and the vibration plate, and at least the width of the pressure generating chamber, which is dose to the space portion, is equal to the width of the space portion or less.

In the first aspect, relative positional accuracy between the piezoelectric element and the pressure generating chamber, that is, a positional accuracy between the piezoelectric element and the vibration region of the vibration plate can be improved. In addition, the compartment wall between the pressure generating chambers can be made thicker to increase the rigidity, thus cross talk between the pressure generating chambers can be reduced.

A second aspect of the ink-jet recording head of the present invention according to the first aspect is characterized in that at least the width of the pressure generating chamber, which is dose to the vibration plate, is approximately equal to the width of the space portion, and outer peripheries of both sides of the space portion in the width direction regulate the width of the pressure generating chamber.

In the second aspect, the relative positional accuracy between the pressure generating chamber and the piezoelectric element is improved, thus ink ejection characteristics are improved.

A third aspect of the ink-jet recording head of the present invention according to any one of the first and second aspects is characterized in that at least a portion of the side surface of the pressure generating chamber is constituted of a slanted surface slanting from the space portion to the inside of the pressure generating chamber.

In the third aspect, ink can be surely supplied to the pressure generating chamber and the space portion.

A fourth aspect of the ink-jet recording head of the present invention according to the third aspect is characterized in that the slanted surface includes an etching stop surface of the passage-forming substrate.

In the fourth aspect, the pressure generating chamber can be formed readily in high accuracy, and as a result, the side surface thereof becomes a slanted surface.

A fifth aspect of the ink-jet recording head of the present invention according to any one of the first to fourth aspects is characterized in that a passage-forming layer is provided between the passage-forming substrate and the vibration plate, and the space portion is formed so as to penetrate the passage-forming layer.

In the fifth aspect, the space portion can be formed readily in high accuracy.

A sixth aspect of the ink-jet recording head of the present invention according to the fifth aspect is characterized in that the passage-forming layer comprises boron-doped polysilicon.

In the sixth aspect, the space portion can be formed in the passage-forming layer readily in high accuracy.

A seventh aspect of the ink-jet recording head of the present invention according to any one of the first to fourth aspects is characterized in that the vibration plate has a step difference portion extending to a direction crossing with the plane direction in a region corresponding to each pressure generating chamber, and the space portion is defined by the step difference portion.

In the seventh aspect, since the space portion is defined by the step difference portion of the vibration plate, the space portion can be formed readily in high accuracy.

An eighth aspect of the ink-jet recording head of the present invention according to the seventh aspect is characterized in that a reinforcement layer, that is provided so as to be tightly attached to the step difference portion, is provided at least in a region corresponding to the outside of the space portion in the width direction.

In the eighth aspect, the strength of the step difference portion is increased by the reinforcement layer, thus a shake of the step difference portion in the plane direction and destruction accompanied with the shake are prevented.

A ninth aspect of the ink-jet recording head of the present invention according to the eighth aspect is characterized in that the reinforcement layer in the region corresponding to each side of the piezoelectric element in the width direction is extended to the upper portion of the step difference portion, which is dose to the piezoelectric element, and the vibration region of the vibration plate is regulated by a gap between the reinforcement layers.

In the ninth aspect, the width of the vibration plate, actually vibrated by the drive of the piezoelectric element, can be appropriately adjusted.

A tenth aspect of the ink-jet recording head of the present invention according to any one of the eighth to ninth aspects is characterized in that the thickness of the reinforcement layer is thicker than height of the step difference portion of the vibration plate.

In the tenth aspect, the strength of the step difference portion is surely increased, thus a shake of the step difference portion in the plane direction and destruction accompanied with the shake are surely prevented.

An eleventh aspect of the ink-jet recording head of the present invention according to any one of the eighth to tenth aspects is characterized in that the reinforcement layer includes an uncontinuous piezoelectric layer that is uncontinuous with the piezoelectric layer of the piezoelectric element.

In the eleventh aspect, the reinforcement layer can be readily formed at the same time as performing patterning for the piezoelectric element.

A twelfth aspect of the ink-jet recording head of the present invention according to any one of the first to eleventh aspects is characterized in that the height of the space portion ranges from 0.1 μm to 100 μm.

In the twelfth aspect, the volume required for ink ejection can be obtained by the pressure generating chamber and the space portion.

A thirteenth aspect of the ink-jet recording head of the present invention according to the twelfth aspect is characterized in that the height of the space portion ranges from 1 μm to 10 μm.

In the thirteenth aspect, the pressure generating chamber and the space portion can be set so as to have a volume suitable for ink ejection.

A fourteenth aspect of the ink-jet recording head of the present invention according to any one of the first to thirteenth aspects is characterized in that an expanded portion having a width wider than the pressure generating chamber and wider than the nozzle orifice is provided in the vicinity of the nozzle orifice of the pressure generating chamber.

In the fourteenth aspect, ink can be well ejected even with the pressure generating chamber having a relatively narrow width.

A fifteenth aspect of the ink-jet recording head of the present invention according to any one of the first to fourteenth aspects is characterized in that the width of the space portion is wider than the width of the piezoelectric active portion constituting the piezoelectric element, and the relation between the width $W_A$ of the pressure generating chamber and the width $W_B$ of the piezoelectric active portion satisfies $W_A < W_B$.

In the fifteenth aspect, the pressure generating chamber and the space portion can be set so as to have the volume required for ink ejection, and the rigidity of the compartment wall can be improved.

A sixteenth aspect of the ink-jet recording head of the present invention according to any one of the first to thirteenth aspects is characterized in that an insulation layer having an open portion in a region opposite to the pressure generating chamber is provided on a surface of the passage-forming substrate, the surface being opposite to the vibration plate, and a portion of the insulation layer projects into the region opposite to the pressure generating chamber.

In the sixteenth aspect, a portion of the insulation layer projects into the region opposite to the pressure generating chamber by forming the pressure generating chamber in the passage-forming substrate from the open portion of the insulation layer via the space portion.

A seventeenth aspect of the ink-jet recording head of the present invention according to any one of the first to sixteenth aspects is characterized in that the passage-forming substrate consists of a single crystal silicon substrate, and the pressure generating chamber is formed by anisotropic etching.

In the seventeenth aspect, the pressure generating chamber can be formed relatively readily and in high accuracy.

An eighteenth aspect of the ink-jet recording head of the present invention according to any one of the first to seventeenth aspects is characterized in that it comprises the ink-jet recording head specified in any one of the first to seventeenth aspects.

In the eighteenth aspect, the ink-jet recording apparatus having improved ink ejection characteristics of the head can be realized.

A nineteenth aspect of the present invention is a manufacturing method for an ink-jet recording head, which comprises: a passage-forming substrate having a pressure generating chamber formed thereon, which communicates with a nozzle orifice; and a piezoelectric element formed of a thin film and by a lithography method via a vibration plate constituting a portion of the pressure generating chamber in a region corresponding to the pressure generating chamber, in which a passage-forming layer is provided between the passage-forming substrate and the vibration plate, and the passage-forming layer has a space portion formed in a region opposite to the pressure generating chamber. The manufacturing method of an ink-jet recording head is characterized by comprising the steps of: forming the passage-forming layer on the passage-forming substrate and imparting etching selectivity to a region that will be the space portion of the passage-forming layer; forming the vibration plate on the passage-forming layer and forming a piezoelectric element on the vibration plate; and performing anisotropic etching for the passage-forming substrate from a surface opposite that having the passage-forming layer to form a penetrated portion at least to a region that will be the space portion of the passage-forming layer, etching the passage-forming layer to form the space portion, and forming a pressure generating chamber opposite the space portion.

In the nineteenth aspect, the pressure generating chamber can be formed readily and in high accuracy by forming the pressure generating chamber via the penetrated portion of the passage-forming substrate and the space portion of the passage-forming layer, and the width of the pressure generating chamber is regulated in high accuracy.

A twentieth aspect of the manufacturing method of an ink-jet recording head of the present invention according to the nineteenth aspect is characterized in that the passage-forming layer comprises polysilicon, and etching selectivity is imparted by doping boron onto a region other than the region that will be the space portion.

In the twentieth aspect, the space portion can be formed in high accuracy and the manufacturing process of the ink-jet recording head can be simplified.

A twenty-first aspect of the present invention is a manufacturing method for an ink-jet recording head, which comprises: a passage-forming substrate having a pressure generating chamber formed thereon, which communicates with a nozzle orifice; and a piezoelectric element formed of a thin film and by a lithography method via a vibration plate constituting a portion of the pressure generating chamber in a region corresponding to the pressure generating chamber, in which a passage-forming layer that consists of boron-doped polysilicon is provided between the passage-forming substrate and the vibration plate, and the passage-forming layer has a space portion formed in a region opposite to the pressure generating chamber. The manufacturing method of an ink-jet recording head is characterized in that it comprises the steps of: forming a polysilicon layer on the passage-forming substrate; doping boron onto a region other than a region in which the wide width portion of the polysilicon layer is formed to make the passage-forming layer; forming the vibration plate on the passage-forming layer and forming a piezoelectric element on the vibration plate; etching the passage-forming substrate from a surface opposite that having the passage-forming substrate to form the pressure generating chamber; and entirely etching the region of the polysilicon layer other than the region having boron doped thereon from the pressure generating chamber to form the space portion.

In the twenty-first aspect, the space portion can be readily formed and in high accuracy by removing the polysilicon layer by etching.

A twenty-second aspect of the manufacturing method of an ink-jet recording head of the present invention according to the twenty-first aspect is characterized in that the step of forming the pressure generating chamber and the step of forming the space portion are continuously performed.

In the twenty-second aspect, the space portion can be formed in high accuracy, and the manufacturing process of the ink-jet recording head can be simplified.

BRIEF DESCRIPTION OF THE DRAWINGS

For a more complete understanding of the present invention and the advantages thereof, reference is now made to the following descriptions in conjunction with the accompanying drawings.

FIGS. 2(*a*) and 2(*b*) are views showing the ink-jet recording head according to embodiment 1 of the present invention: FIG. 2(*a*) is a plan view showing principal portions of FIG. 1; and FIG. 2(*b*) is a cross-sectional view showing the principal portions thereof.

FIG. 6(*a*) is a plan view; and FIG. 6(*b*) is a cross-sectional view thereof.

FIG. 7(*a*) is a plan view; and FIG. 7(*b*) is a cross-sectional view thereof.

FIG. 8(*a*) is a plan view; and FIG. 8(*b*) is a cross-sectional view thereof.

FIG. 10(*a*) is a plan view; and FIG. 10(*b*) is a cross-sectional view thereof.

FIG. 11(*a*) is a plan view; and FIG. 11(*b*) is a cross-sectional view thereof.

DESCRIPTION OF THE PREFERRED EMBODIMENTS

The present invention will be described in detail based on the embodiments below.

(Embodiment 1)

Figure 1:
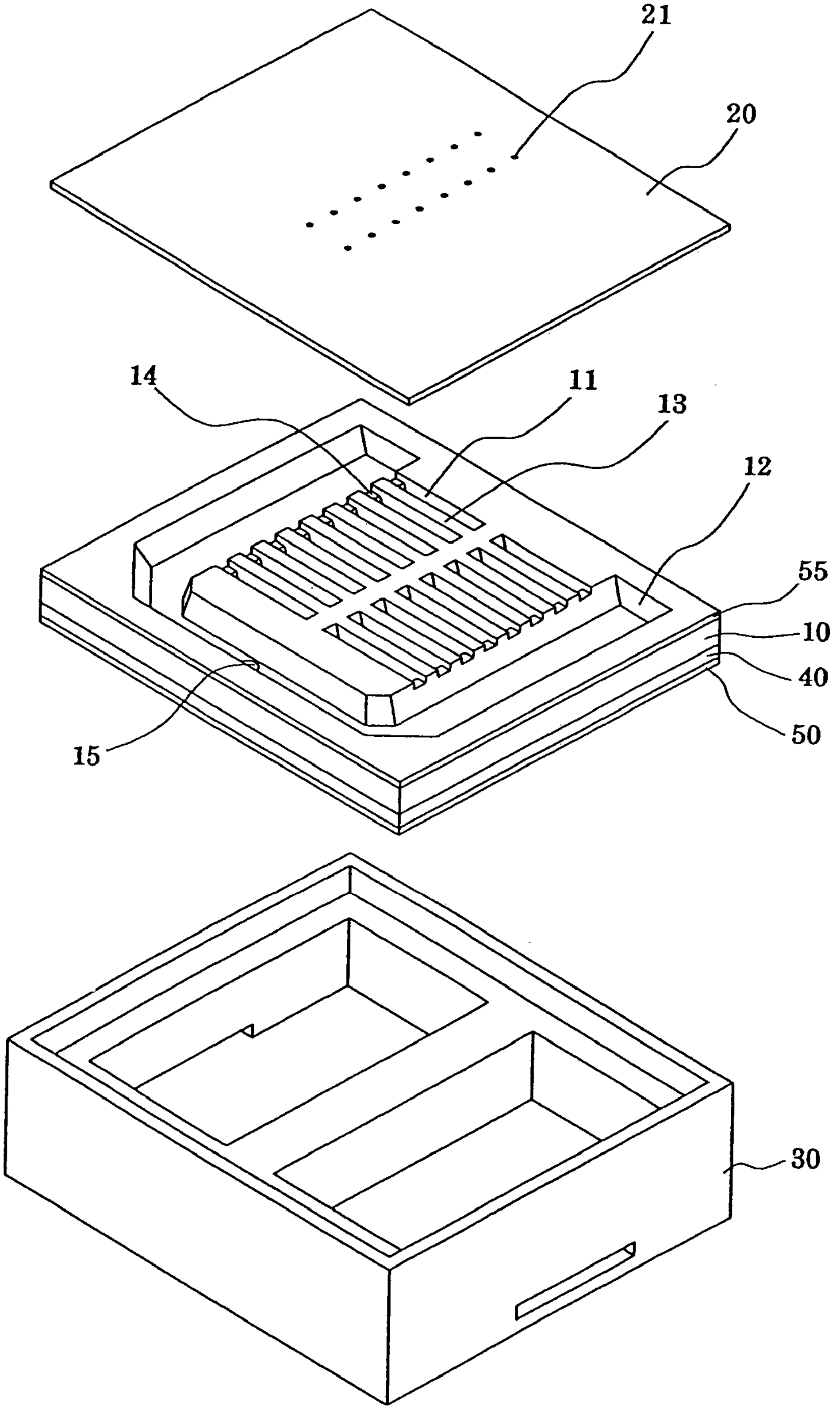
FIG. 1 is an exploded perspective view of an ink-jet recording head according to one embodiment of the present invention.
Figure 3A:
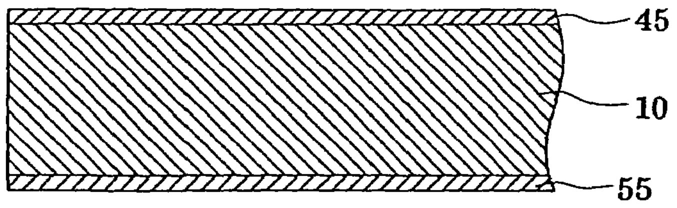
FIGS. 3(*a*) to 3(*d*) are cross-sectional views showing a manufacturing process of the ink-jet recording head according to embodiment 1 of the present invention.
Figure 3B:
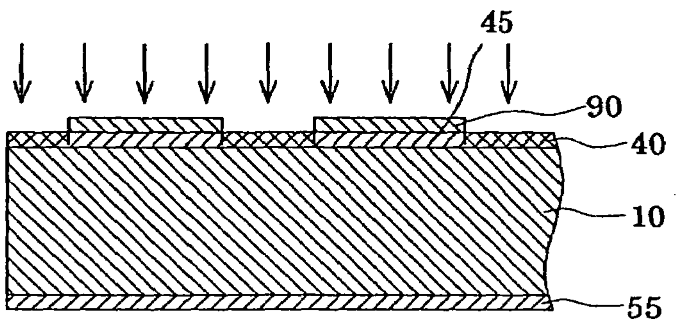
Figure 3C:
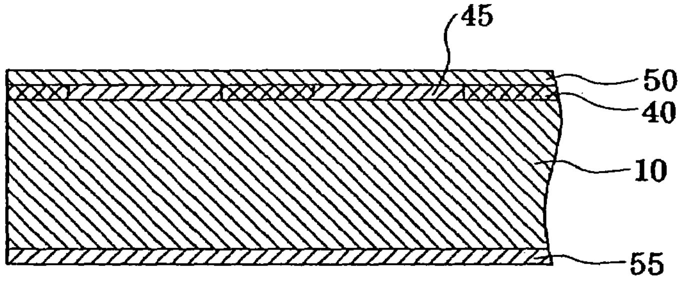
Figure 3D:
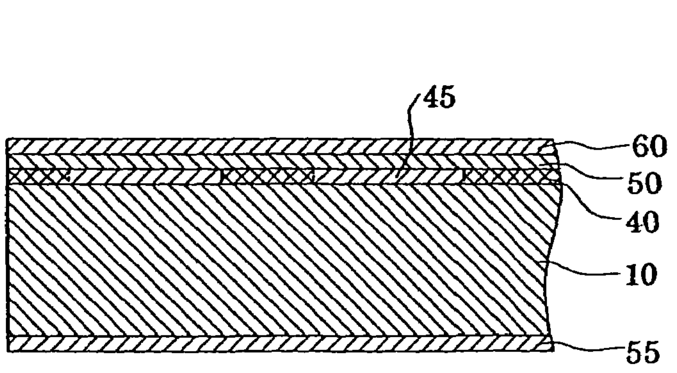
Figure 4A:
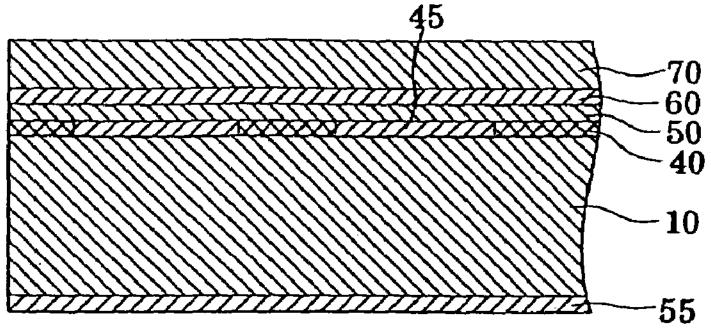
FIGS. 4(*a*) to 4(*d*) are cross-sectional views showing the manufacturing process of the ink-jet recording head according to embodiment 1 of the present invention.
Figure 4B:
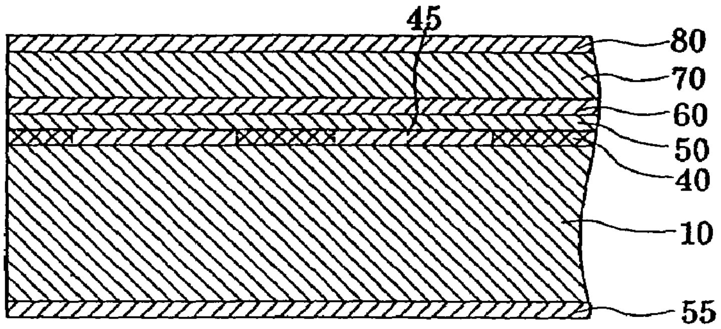
Figure 4C:
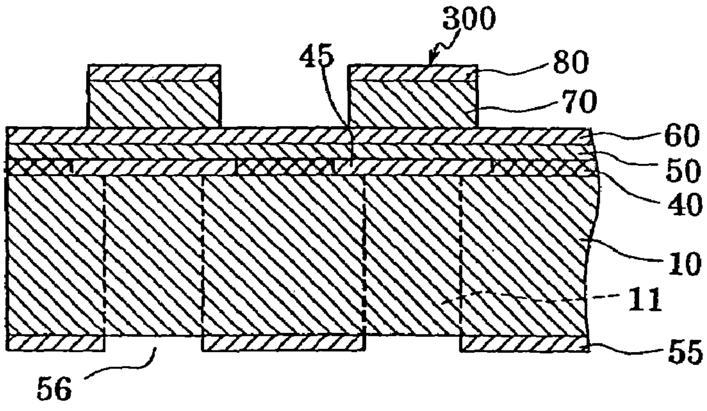
Figure 4D:
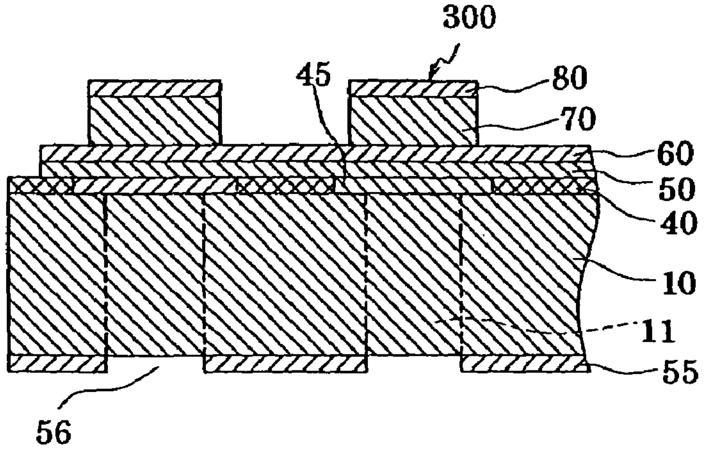

FIG. 1 is an exploded perspective view showing the ink-jet recording head according to embodiment 1 of the present invention. FIG. 2(*a*) is a plan view showing principal portions of the ink-jet recording head, and FIG. 2(*b*) is a view showing a cross-sectional structure of the pressure generating chamber as one of the principal portions along the longitudinal direction.

As shown in the drawings, a passage-forming substrate 10 consists of a single crystal silicon substrate having a plane (110) of the plane orientation in this embodiment. As the passage-forming substrate 10, a plate having a thickness of about 150 to 300 μm is typically used, and a plate desirably having a thickness of about 180 to 280 μm, more desirably, about 220 μm is preferable. This is because array density can be increased while maintaining the rigidity of the compartment walls between the pressure generating chambers adjacent from one to another.

In the passage-forming substrate 10, pressure generating chambers 11 and a reservoir 12 supplying ink to the pressure generating chambers 11 are formed. Specifically, the passage-forming substrate 10 is penetrated by anisotropic etching in the thickness direction, thus two rows of the pressure generating chambers 11 divided by a plurality of compartment walls 13 and the reservoir 12 arranged in an approximately U-character shape so as to surround three sides of the rows of the pressure generating chambers 11 are formed. In addition, one end of each pressure generating chamber 11 in the longitudinal direction communicates with the reservoir 12 via an ink supplying path 14, while the other end thereof communicates with a nozzle orifice 21 formed in a nozzle plate 20 (to be described later). On an approximately central portion of the reservoir 12, an ink introducing path 14 for supplying ink from the outside to the reservoir 12 is formed.

On one surface of the passage-forming substrate 10, for example, a passage-forming layer 40 that consists of boron-doped polysilicon and an elastic film 50 that consists of zirconium dioxide are formed. In the passage-forming layer 40, a space portion 41 is formed in a region opposite to the pressure generating chamber 11.

On the other hand, the other surface of the passage-forming substrate 10 is an open surface, and a silicon dioxide layer 55 as an insulation layer is formed on the surface thereof by performing thermal oxidation of the surface of the passage-forming substrate 10. In addition, on the silicon dioxide layer 55, the nozzle plate 20 having nozzle orifices 21 drilled therein is adhered via adhesive, a thermal welding film or the like. Note that, the nozzle plate 20 consists of glass ceramic or anti-corrosive steel having a thickness of, for example, 0.1 to 1 mm, and a linear expansion coefficient of, for example, 2.5 to 4.5[$\times 10^{-6}$/° C.] at a temperature of 300° C. or less. One surface of the nozzle plate 20 entirely covers the passage-forming substrate 10, and also plays the role of a reinforcement plate for protecting the passage-forming substrate 10 as a single crystal silicon substrate from an impact or an external force.

Herein, the size of the pressure generating chamber 11 giving ink an ink droplet ejection pressure and the size of the nozzle orifice 21 ejecting ink droplets are optimized according to the amount of ejected ink droplets, ejection speed and ejection frequency. For example, in the case where 360 ink droplets per one inch are recorded, it is necessary that the nozzle orifice 21 be formed with a diameter of several ten micrometers in good accuracy.

On the other hand, on the elastic film 50 provided via the passage-forming layer 40 on the surface of the passage-forming substrate 10 that is opposite that having the open surface, a lower electrode film 60 with a thickness of, for example, about 0.2 to 0.5 μm, a piezoelectric layer 70 with a thickness of, for example, about 1 μm and an upper electrode film 80 with a thickness of, for example, about 0.1 μm are formed in a laminated state, which constitute a piezoelectric element 300. Herein, the piezoelectric element 300 indicates a portion that includes the lower electrode-film 60, the piezoelectric layer 70 and the upper electrode film 80. Generally, the piezoelectric element 300 is constituted such that any one of the electrodes of the piezoelectric element 300 is made to be a common electrode, and that the other electrode and the piezoelectric layer 70 are subjected to patterning for each pressure generating chamber 11. And, in this case, the portion that is constituted of any one of the electrodes and the piezoelectric layer 70, to which patterning is performed, and where piezoelectric distortion is generated by application of voltage to both electrodes, is referred to as a piezoelectric active portion 320. In the present embodiment, the lower electrode film 60 is made to be a common electrode of the piezoelectric element 300, the upper electrode film 80 is made to be an individual electrode of the piezoelectric element 300, and the piezoelectric active portion 320 is formed for each pressure generating chamber 11. In addition, herein, the piezoelectric element 300 and the elastic film where displacement is generated by a drive of the piezoelectric element 300 are referred to as a piezoelectric actuator in combination. Note that, although the elastic film 50 and the lower electrode film 60 function as a vibration plate in the above-described example, the lower electrode film may also function as the elastic film.

Herein, description will be made for a manufacturing process of the ink-jet recording head of the present embodiment, particularly a process for forming the pressure generating chamber 11 in the passage-forming substrate 10 and a process for forming the piezoelectric element 300 in a region corresponding to the pressure generating chamber 11. FIGS. 3(*a*) to 5(*c*) are cross-sectional views of the pressure generating chamber 11 along the longitudinal direction.

Firstly, as shown in FIG. 3(*a*), a wafer of a single crystal silicon substrate that will be the passage-forming substrate 10 is thermally oxidized in a diffusion furnace at about 1100° C. to form the silicon dioxide layers 55 on both surfaces of the plate. Then, after removing the silicon dioxide layer 55 on one surface, a polysilicon layer 45 is formed.

Secondly, as shown in FIG. 3(*b*), a protective film 90 that consists of, for example, silicon oxide, silicon nitride or the like is formed on a region of the polysilicon layer 45 that will be a space portion 41, thereafter, boron is doped on the other region of the polysilicon layer 45 to form the passage-forming layer 40 that consists of boron-doped polysilicon on a portion of the polysilicon layer 45. In other words, the polysilicon layer 45 remains only in the region that will be the space portion 41, and the other portion becomes the passage-forming layer 40 that consists of boron-doped polysilicon. Accordingly, the space portion 41 can be formed readily and in high accuracy by etching the polysilicon layer 45 in a process (to be described later).

Subsequently, as shown in FIG. 3(*c*), after removing the protective film 90, the elastic film 50 is formed on the passage-forming layer 40. For example in the present embodiment, after forming a zirconium layer on the passage-forming layer 40, the zirconium layer, is thermally oxidized in a diffusion furnace at 500 to 1200° C. to form the elastic film 50 that consists of zirconium oxide.

Subsequently, as shown in FIG. 3(*d*), the lower electrode film 60 is formed by sputtering. As a material of the lower electrode film 60, platinum or the like is preferable. This is because the piezoelectric layer 70 (to be described later), which is deposited by a sputtering method or a sol-gel method, is required to be sintered at about 600 to 1000° C. under the atmosphere or an oxygen atmosphere to be crystallized after the film is deposited. In other words, the material of the lower electrode film 60 must maintain conductivity under such high temperature and oxidization atmosphere, specifically when lead zirconium titanate is used as the piezoelectric layer 70, changes in conductivity due to diffusion of lead oxide are desirably small. For these reasons, platinum is preferable.

Next, as shown in FIG. 4(*a*), the piezoelectric layer 70 is deposited In the present embodiment, a so-called sol-gel method is used to form the piezoelectric layer 70. In the sol-gel method, a so-called sol obtained by dissolving/dispersing metal organic matter into a catalyst is coated and dried in a gel state, and then is sintered at a high temperature. As a material of the piezoelectric layer 70, a PZT (lead zirconium titanate) series material is preferable when it is used in the ink-jet recording head. Note that the deposition method of the piezoelectric layer 70 is not specifically limited. For example, the deposition may be performed by a sputtering method.

Next, as shown in FIG. 4(*b*), the upper electrode film 80 is deposited. It is satisfactory that the upper electrode film 80 is made of a material with high conductivity, and various kinds of metals such as iridium, aluminum, gold, nickel and platinum, conductive oxide or the like can be used. In the present embodiment, platinum is deposited by sputtering.

Subsequently, as shown in FIG. 4(*c*), the piezoelectric layer 70, the upper electrode layer 80 and the silicon dioxide layer 55 are simultaneously subjected to resist-patterning, and the piezoelectric layer 70 and the upper electrode film 80 are etched to perform patterning for the piezoelectric element 300, then the silicon dioxide layer 55 is etched to form an open portion 56 on the region of the passage-forming substrate 10 where the pressure generating chamber 11 is formed. Thereafter, as shown in FIG. 4(*d*), the lower electrode film 60 and the elastic film 50 are etched and subjected to patterning in a specified shape. Note that, in FIGS. 4(*c*) and 4(*d*), the pressure generating chamber 11 is shown by a dotted line because it is not formed yet.

The film-forming process has been described as above. After performing film-forming in such a manner, the pressure generating chamber 11, the space portion 41 and the like are former.

Figure 5A:
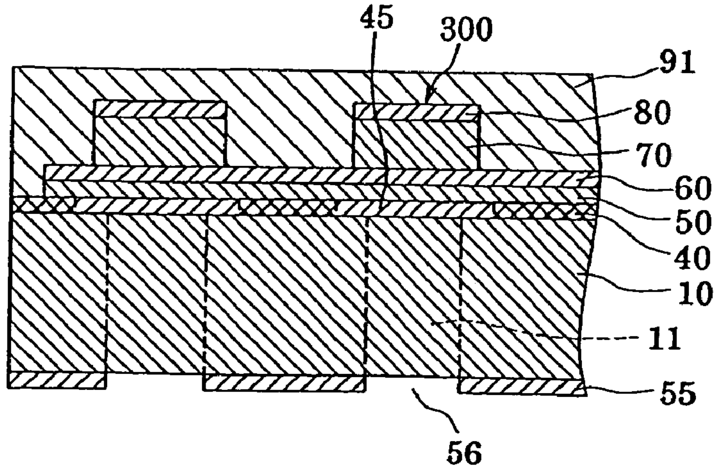
FIGS. 5(*a*) to 5(*c*) are cross-sectional views showing the manufacturing process of the ink-jet recording head according to embodiment 1 of the present invention.
Figure 5B:
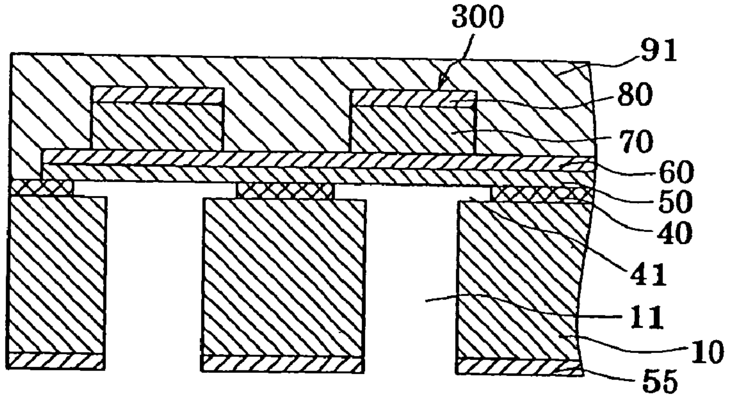
Figure 5C:
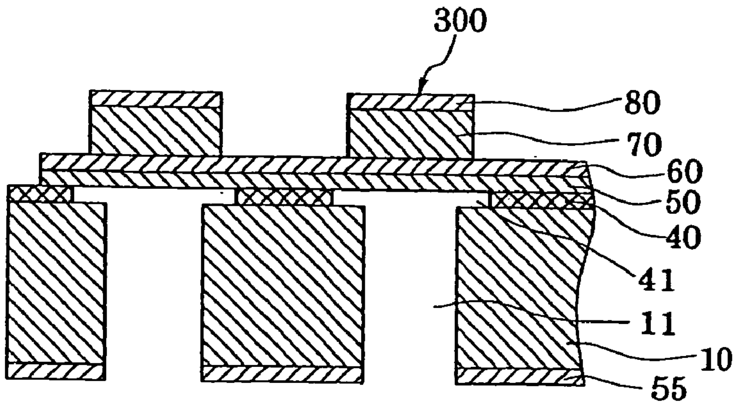

Firstly, as shown in FIG. 5(*a*), a protective film 91 is formed on the surface of the piezoelectric element 300. The protective film 91 is formed for preventing destruction of the piezoelectric element 300, particularly the piezoelectric layer 70 when the passage-forming substrate 10 and the polysilicon layer 45 are etched.

Secondly, as shown in FIG. 5(*b*), the passage-forming substrate 10 that consists of a single crystal silicon substrate is subjected to anisotropic etching with the silicon dioxide layer 55, where patterning is performed, as a mask to form the pressure generating chamber 11, and the polysilicon layer 45 is removed to form the space portion 41.

Herein, the anisotropic etching is performed by use of the following property of a single crystal silicon substrate. Specifically, when the single crystal silicon substrate is immersed in alkali solution such as potassium hydroxide (KOH), it is gradually eroded, a first plane (111) perpendicular to the plane (110) and a second plane (111) at an angle of about 70° with the first plane (111) and at an angle of about 35° with the foregoing plane (110) appear, and the etching rate of the plane (111) is about 1/180 as compared with the etching rate of the plane (110). An accurate process can be performed by such anisotropic etching on the basis of a depth process in a parallelogram shape formed of first two planes (111) and second two slanted planes (111), thus the pressure generating chambers 11 can be arrayed in a high density. In the present embodiment, the long sides of each pressure generating chamber 11 are formed of the first planes (111) and short sides thereof are formed of the second planes (111).

In addition, although the polysilicon layer 45 is etched by an alkali solution such as KOH, the etching rate of the passage-forming layer 40 that consists of boron-doped polysilicon by alkali solution is extremely slow. Accordingly, when the passage-forming substrate 10 is etched to form the pressure generating chamber 11, etching is performed for the polysilicon layer 45 from the pressure generating chamber 11 until the etching reaches the passage-forming layer 40, thus the space portion 41 can be formed readily and in high accuracy.

Note that, after forming the pressure generating chamber 11 in such a manner, as shown in FIG. 5(*c*), the protective film 91 covering the piezoelectric element 300 is removed.

A series of the film forming and anisotropic etching processes described above simultaneously forms a number of chips on one wafer, and after termination of the processes, divides the wafer into each passage-forming substrate 10 with one chip size as shown in FIG. 1. In addition, the passage-forming substrate 10 obtained by dividing the wafer is adhered to the nozzle plate 20 to be united therewith, thus forming the ink-jet recording head. Thereafter, the ink-jet recording head is fixed to a holder 30, mounted on a carriage, and incorporated in the ink-jet recording apparatus.

After introducing ink from an ink introducing hole 15 connected to external ink supplying means (not shown) and filling the reservoir 12 with ink, the ink-jet recording head thus constituted applies a voltage between the lower electrode film 60 and the upper electrode film 80 according to the recording signal from an external drive circuit (not shown) to warp and deform the elastic film 50, the lower electrode film 60 and the piezoelectric layer 70. Therefore, the pressure in the pressure generating chamber 11 is increased to eject ink droplets from the nozzle orifice 21.

Figure 6A:
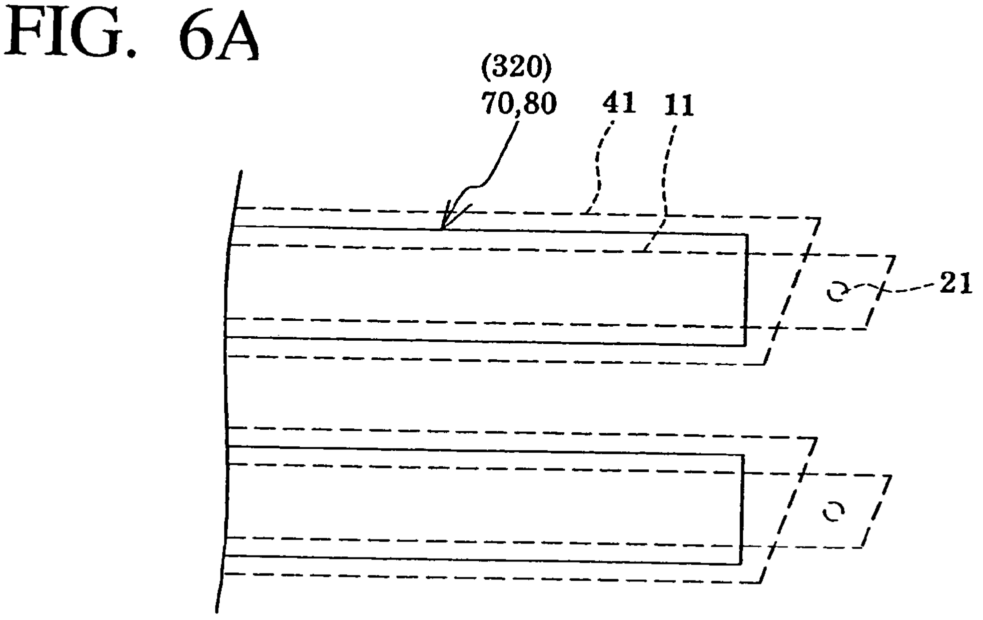
FIGS. 6(*a*) and 6(*b*) are views showing the principal portions of the ink-jet recording head according to embodiment 1 of the present invention.
Figure 6B:
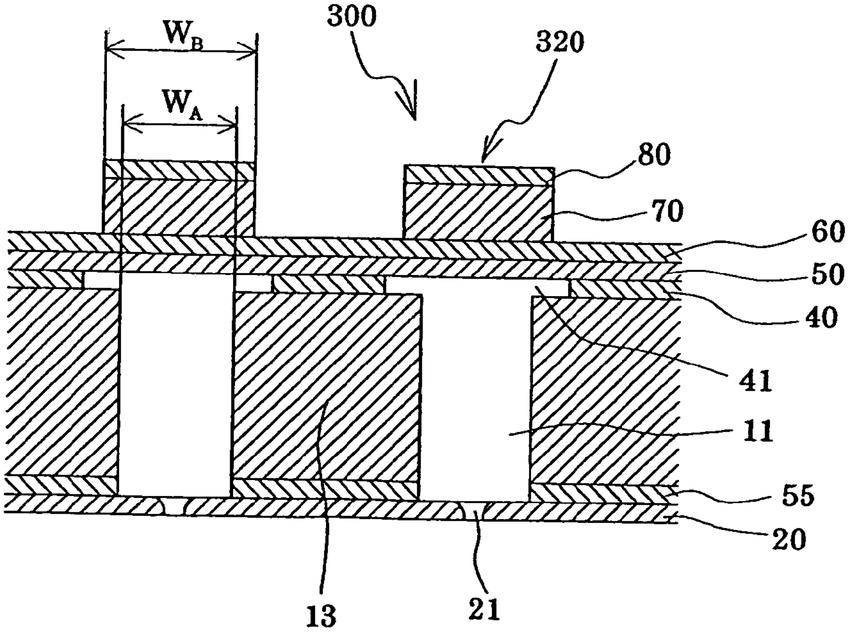

FIGS. 6(*a*) and 6(*b*) are respectively a plan view and a cross-sectional view showing principal portions of the ink-jet recording head of the present embodiment, which is formed in such a manner.

As shown in FIG. 6(*a*), in the ink-jet recording head of the present embodiment, the regions between the passage-forming substrate 10 and the elastic film 50, which correspond to the pressure generating chamber 11, the space portion 41 are defined by the passage-forming layer 40. In the region facing the space portion 41, the piezoelectric element 300 that consists of the lower electrode film 60, the piezoelectric layer 70 and the upper electrode film 80 is provided. In the region opposite to the space portion 41 and not contacting peripheral walls, the piezoelectric active portion 320 that consists of the piezoelectric layer 70 and the upper electrode film 80 is formed.

Herein, as shown in FIG. 6(*b*), the space portion 41 is formed to be larger in width than the piezoelectric active portion 320, and a width of the vibration region of the vibration plate by a drive of the piezoelectric element 300 is regulated by both outer peripheries of the space portion 41 in the width direction. In addition, the size of each pressure generating chamber 11 in the width direction is adjusted so that the compartment wall 13 can have a sufficient thickness so as not to cause cross talk between the pressure generating chambers 11 adjacent to each other.

The space portion 41 may substantially constitute a portion of the pressure generating chamber 11. In this case, the space portion 41 preferably has sufficient volume to eject a specified amount of ink. Specifically, the height of the space portion 41, that is, the film thickness of the passage-forming layer 40 preferably ranges from 0.1 μm to 100 μm, more preferably, from 1 μm to 10 μm.

It is preferable that the width $W_A$ of the pressure generating chamber 11 be narrower than the width $W_B$ of the piezoelectric active portion 320, specifically, that the width $W_A$ be formed so that a relation of $W_A<W_B$ can be established. Thus, the compartment wall 13 between the pressure generating chambers 11 can be made sufficiently thick.

As described above, with such constitution of the present embodiment, since the vibration region of the vibration plate is regulated by the outer peripheries of the space portion 41, positional accuracy between the vibration region of the vibration plate and the piezoelectric element 300 is improved, thus ink droplets can be ejected effectively. In addition, since the width of each pressure generating chamber 11 can be made relatively narrow, the rigidity of compartment wall 13 between the pressure generating chambers 11 can be sufficiently increased, thus cross talk can be surely prevented.

Moreover, in the present embodiment, the pressure generating chamber 11 and the space portion 41 are formed such that the polysilicon layer 45 is formed on the passage-forming substrate 10, boron is doped on the region other than that forming the space portion 41 to form the passage-forming layer 40 that consists of boron-doped polysilicon, and the remaining polysilicon layer 45 (other than the region where boron is doped) is etched together with the passage-forming substrate 10. Thus, the space portion 41 can be readily formed into a desired shape by etching the polysilicon layer 45 until the etching reaches the passage-forming layer 40. In addition, since the etching for the polysilicon layer 45 surely stops at a point where it reaches the passage-forming layer 40, the positional accuracy of the space portion 41 can be significantly improved.

Note that, in the present embodiment, boron is doped to the polysilicon layer to form the passage-forming layer that consists of boron-doped polysilicon, thus etching selectivity is imparted. However, the material of the passage-forming layer is not specifically limited, and it is sufficient that the material can impart etching selectivity.

Moreover, in the present embodiment, the pressure generating chamber 11 and the space portion 41 are formed by performing continuously etching. As a matter of course, they may be formed by performing etching separately.

(Embodiment 2)

Figure 7A:
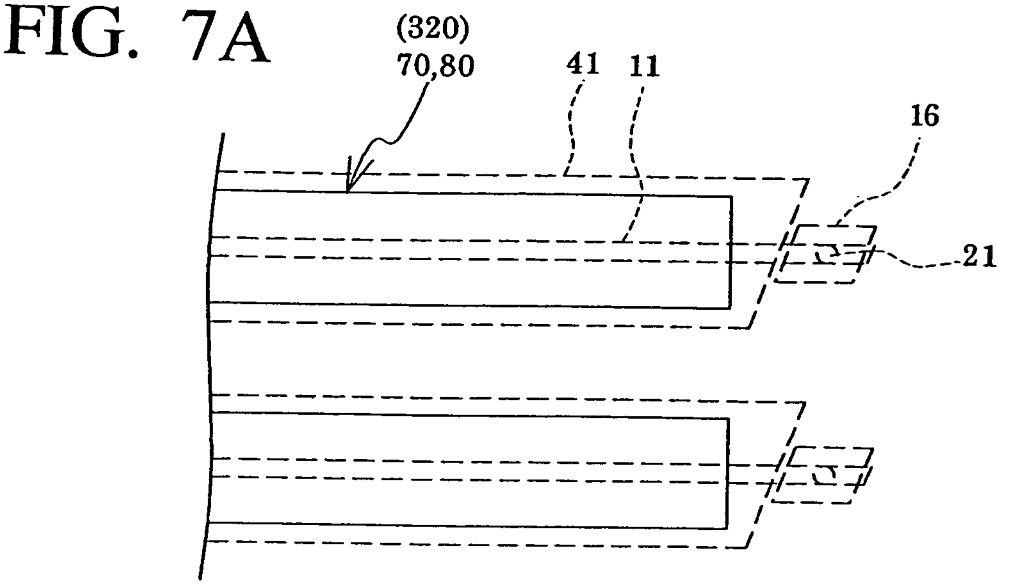
FIGS. 7(*a*) and 7(*b*) are views showing principal portions of the ink-jet recording head according to embodiment 2 of the present invention.
Figure 7B:
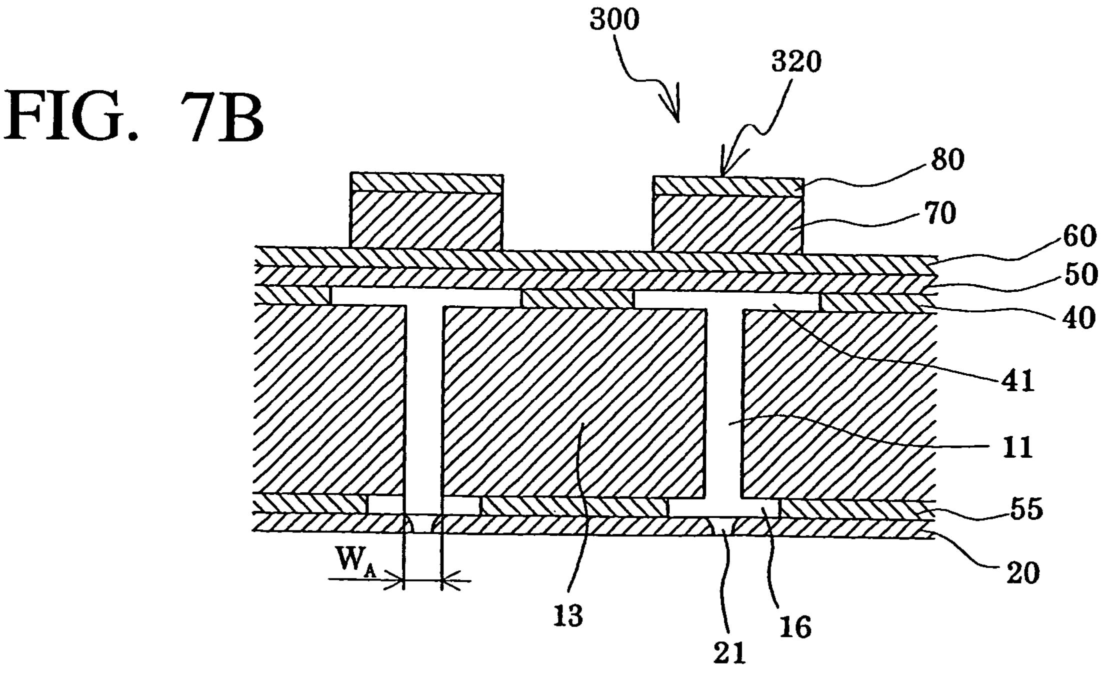

FIGS. 7(*a*) and 7(*b*) are respectively a plan view and a cross-sectional view showing principal portions of the ink-jet recording head according to embodiment 2.

As shown in FIGS. 7(*a*) and 7(*b*), the present embodiment is an example where the width of the pressure generating chamber 11 is made equal to the diameter of the nozzle orifice 21 or less. The present embodiment is similar to embodiment 1 except that a nozzle expansion portion 16 having a width wider than the diameter of the nozzle orifice 21 and wider than the width of the pressure generating chamber 11 is provided in the communicating portion between the pressure generating chamber 11 and the nozzle orifice 21.

Herein, the relation between the width of the pressure generating chamber 11 and the diameter of the nozzle orifice 21 is not specifically limited. However, in the case where the width $W_A$ of the pressure generating chamber 11 is equal to the diameter of the nozzle orifice 21 or less as in the present embodiment, it is preferable to provide the nozzle expansion portion 16.

With such a constitution, the rigidity of the compartment wall 13 between the pressure generating chambers 11 is further improved, thus cross talk can be more surely prevented. In addition, the nozzle expansion portion 16 is provided in a portion corresponding to the nozzle orifice 21, thus ink can be well ejected even if the width of the pressure generating chamber 11 is relatively narrow.

Note that, the nozzle expansion portion 16 may be provided only in the region corresponding to the nozzle orifice 21 as described above, however, if also may be provided across the longitudinal direction of the pressure generating chamber 11.

(Embodiment 3)

Figure 8A:
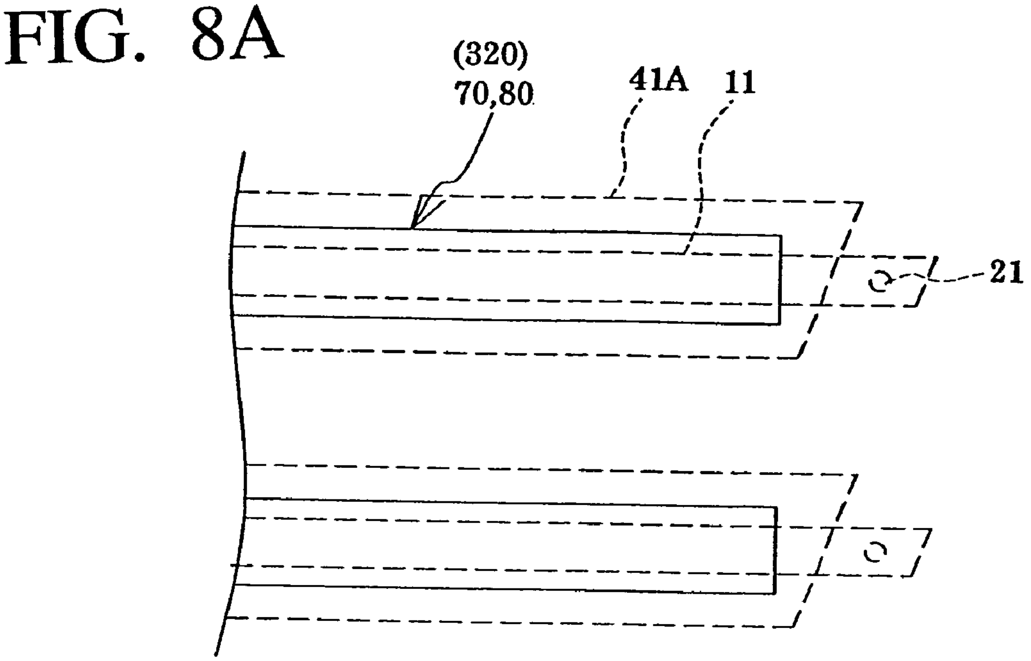
FIGS. 8(*a*) and 8(*b*) are views showing principal portions of the ink-jet recording head according to embodiment 3 of the present invention.
Figure 8B:
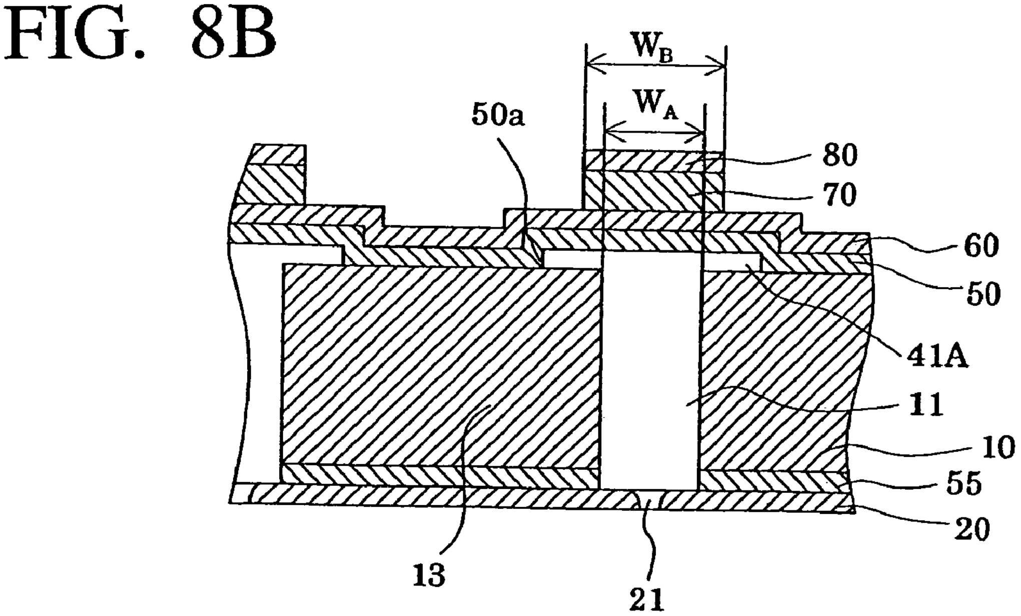

FIGS. 8(*a*) and 8(*b*) are respectively a plan view and a cross-sectional view showing principal portions of the ink-jet recording head according to embodiment 3.

As shown in FIGS. 8(*a*) and 8(*b*), the present embodiment is similar to embodiment 1 except that a step difference portion extending opposite to the passage-forming substrate 10 is provided in the elastic film 50 in the region corresponding to the pressure generating chamber and a space portion 41A is defined by the step difference portion and the passage-forming substrate.

Note that, in the case where the space portion 41A substantially constitutes a portion of the pressure generating chamber 11, the height of the space portion 41A, that is, the height of the step difference portion 50*a* of the elastic film 50, is preferably set to be in the range of 0.1 μm to 100 μm, more preferably, 1 μm to 10 μm.

Also with such a constitution of the present embodiment, since the vibration region of the vibration plate is regulated by the outer periphery of the space portion 41A as in the above-described embodiments, the positional accuracy between the vibration region of the vibration plate and the piezoelectric element 300 is improved, thus ink droplets can be ejected effectively. In addition, since the width of each pressure generating chamber 11 can be made relatively narrow, the rigidity of the compartment wall 13 between the pressure generating chambers 11 can be made sufficiently high, thus cross talk can be prevented.

Note that the forming method of the step difference portion 50*a* of the elastic film 50 is not specifically limited, however, it can be formed as follows for example.

Figure 9A:
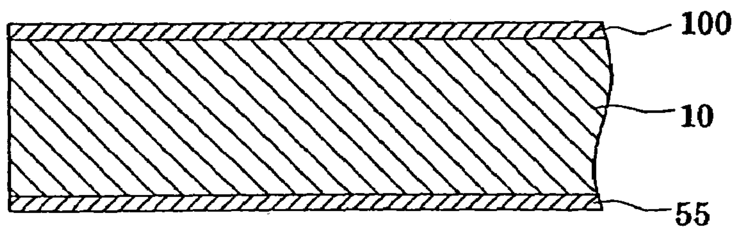
FIGS. 9(*a*) to 9(*c*) are cross-sectional views showing a manufacturing process of the ink-jet recording head according to embodiment 2 of the present invention.
Figure 9B:
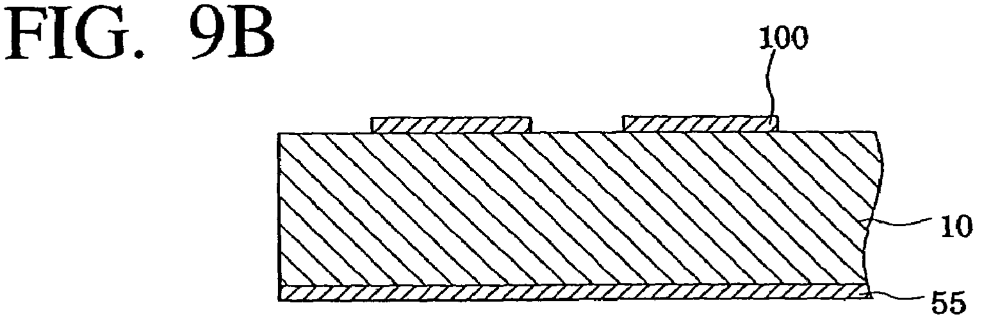
Figure 9C:
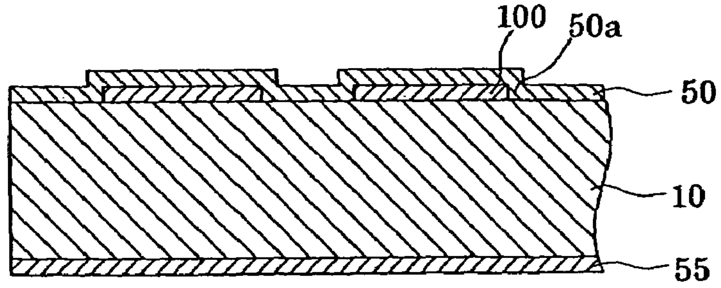

Firstly, as shown in FIG. 9(*a*), a single crystal silicon substrate that will be the passage-forming substrate 10 is thermally oxidized to form the silicon dioxide layers 55 on both surfaces of the plate, and the silicon dioxide film on one surface is etched. Thereafter, a sacrifice layer 100 that consists of polysilicon or the like is formed. The material of the sacrifice layer 100 is not specifically limited as long as it can be removed relatively readily by etching or the like, and polysilicon or the like can be used for example.

Secondly, as shown in FIG. 9(*b*), the sacrifice layer 100 is subjected to patterning for each region corresponding to the space portion 41A by, for example, ion milling or the like.

Subsequently, as shown in FIG. 9(*c*), the elastic film 50 is formed entirely across the passage-forming substrate 10 and the sacrifice layer 100. For example, in the present embodiment, after forming a zirconium layer on the passage-forming substrate 10 and the sacrifice layer 100, the formed zirconium layer is thermally oxidized in a diffusion furnace at 500 to 1200° C. to form the elastic film 50 that consists of zirconium oxide. In this case, the step difference portion 50*a* extending in the direction crossing with the plane direction is formed on a portion corresponding to the side surface of the sacrifice layer 100.

Note that, thereafter, the piezoelectric element 300 is formed similarly to the above-described embodiments, and the passage-forming substrate 10 is etched to form the pressure generating chamber 11 and the sacrifice layer 100 is removed, thus the space portion 41A is formed.

As described above, with the constitution of the present embodiment, the space portion 41A can be readily formed by removing the sacrifice layer 100, and it is satisfactory that the sacrifice layer 100 is entirely etched without need of controlling etching time, thus the dimensional accuracy of the space portion 41A can be significantly improved.

(Embodiment 4)

Figure 10A:
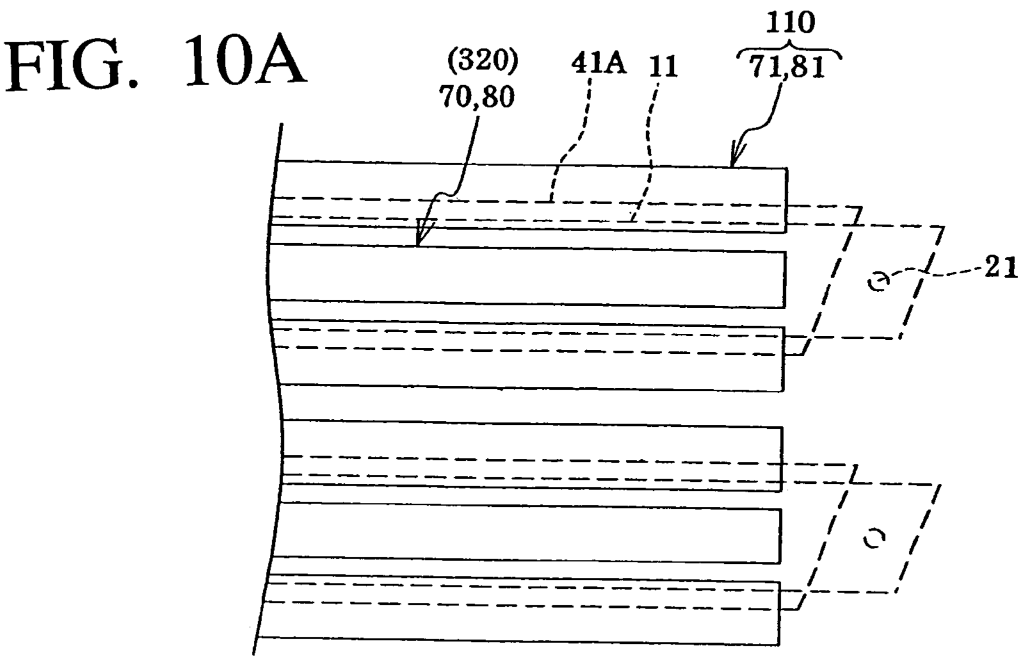
FIGS. 10(*a*) and 10(*b*) are views showing the principal portions of the ink-jet recording head according to embodiment 3 of the present invention.
Figure 10B:
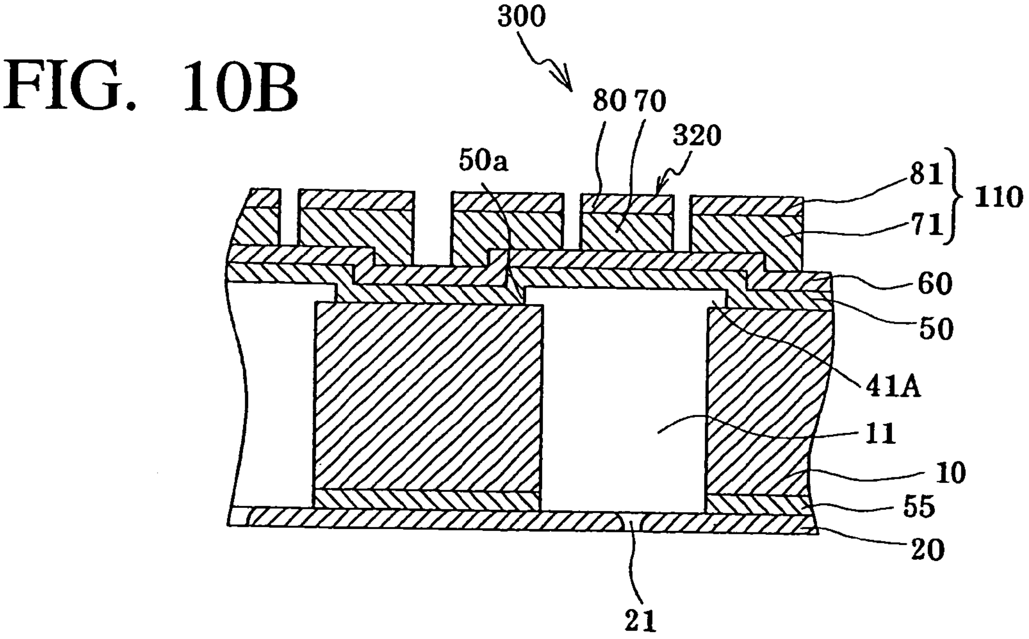

FIGS. 10(*a*) and 10(*b*) are respectively a plan view and a cross-sectional view showing principal portions of the ink-jet recording head according to embodiment 4.

The present embodiment is a modification example of embodiment 3. The present embodiment is similar to embodiment 3 except that reinforcement layers 110 tightly attached to the step difference portions 50*a* are provided on the regions corresponding to the step difference portions 50*a*of the elastic film 50*a*, for example, the regions corresponding to both sides of the piezoelectric element 300 in the width direction as shown in FIGS. 10(*a*) and 10(*b*).

Herein, in the present embodiment, the reinforcement layer 110 consists of uncontinuous piezoelectric layers 71 uncontinuous with the piezoelectric layer 70 constituting the piezoelectric element 300 and uncontinuous upper electrode films 81 uncontinuous with the upper electrode film 80 of the piezoelectric element 300. In addition, each reinforcement layer 110 is formed to be thicker than the height of the step difference portion 50*a*, and is extended from the outside of the step difference portion 50*a* to the upper portion of the piezoelectric element 300. In the present embodiment, the vibration region of the vibration plate, that is, the vibration region by a drive of the piezoelectric element 300 is regulated by gaps between the reinforcement layers 110.

With such a constitution, the strength of the step difference portion 50*a* of the elastic film 50 is increased, thus a shake (vibration) of the elastic film 50 in the plane direction and destruction accompanied with this vibration can be prevented by the reinforcement layer 110.

Note that, in the present embodiment, the reinforcement layer 110 is formed of the uncontinuous piezoelectric layer 71 and the uncontinuous upper electrode layer 81. But not being limited to this, for example, the reinforcement layer 110 may be formed only of the uncontinuous piezoelectric layer 71. As a matter of course, the reinforcement layer 110 may be formed separately.

In addition, in the present embodiment, the reinforcement layers 110 are provided on the both sides of the piezoelectric active portion 320 in the width direction, however, the reinforcement layers 110 may be provided on both sides of the piezoelectric active portion 320 in the longitudinal direction.

(Embodiment 5)

Figure 11A:
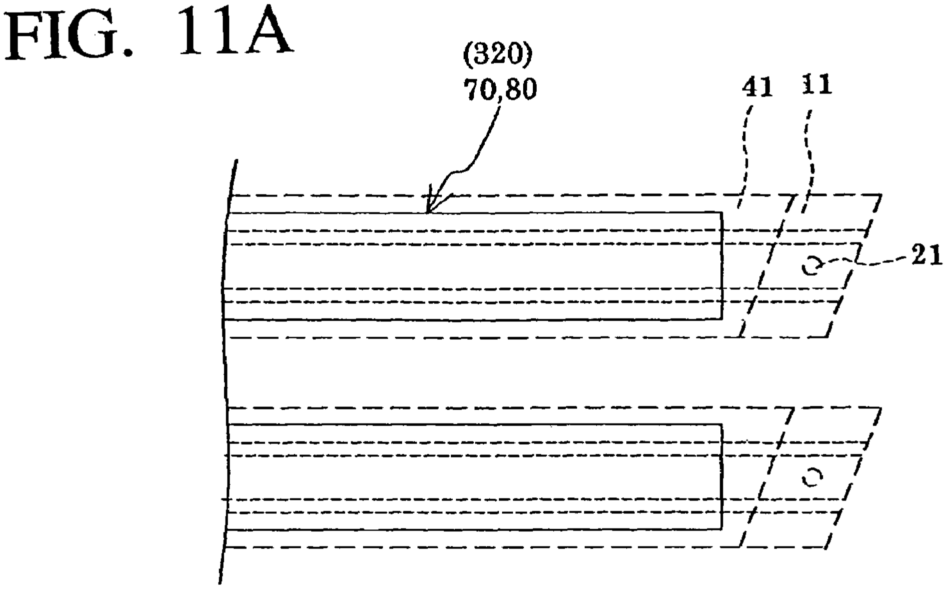
FIGS. 11(*a*) and 11(*b*) are views showing principal portions of the ink-jet recording head according to embodiment 4 of the present invention.
Figure 11B:
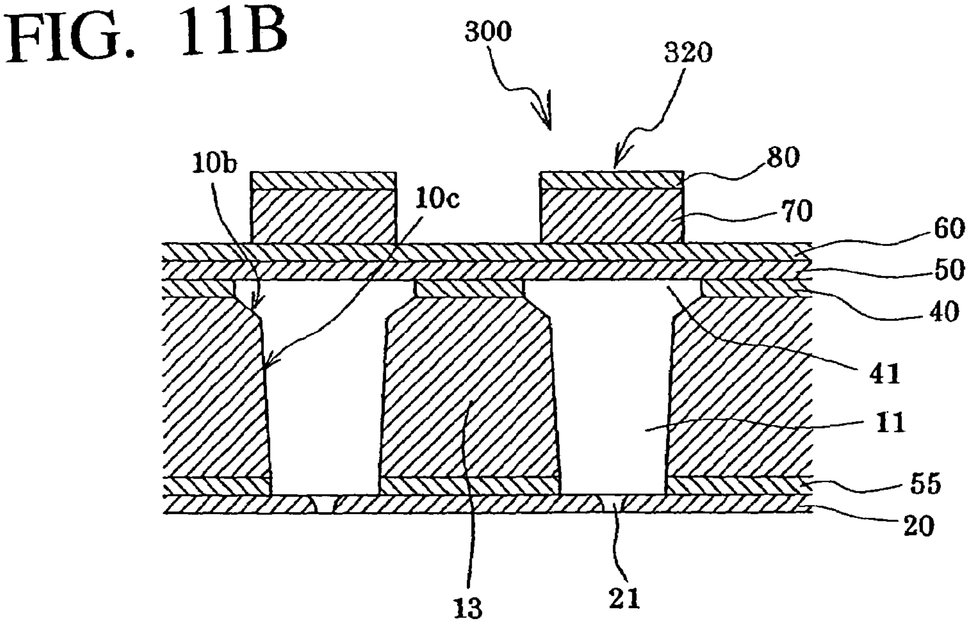

FIGS. 11(*a*) and 11(*b*) are respectively a plan view and a cross-sectional view showing principal portions of the ink-jet recording head according to embodiment 5.

The present embodiment is an example where the width of the portion of the pressure generating chamber 11, the portion being dose to the vibration plate, is made approximately equal to the width of the space portion 41, that is, the width of the pressure generating chamber 11 is regulated by the outer peripheries of both sides of the space portion 41 in the width direction.

Specifically, as shown in FIGS. 11(*a*) and 11(*b*), the present embodiment is similar to embodiment 1 except that the end surfaces of the pressure generating chamber 11 in the width direction are constituted of two slanted surfaces slanting from the outer peripheries of the space portion 41 in the width direction to the inside of the pressure generating chamber.

In addition, the ink-jet recording head in the present embodiment as described above is formed in the process described below.

Firstly, similarly to the above-described embodiments, the passage-forming layer 40, the vibration plate and the piezoelectric element 300 are formed on the passage-forming substrate 10 (see FIGS. 3(*a*) to 4(*d*)).

Herein, when the piezoelectric layer 70 and the upper electrode film 80 are etched to perform patterning for the piezoelectric element 300, the silicon dioxide layer 55 is subjected to patterning to form the open portion 56. This open portion 56 needs to be formed in a region that will be the space portion 41, that is, so as to be in a width narrower than the width of the space portion 41.

This is because, in the process described later, at least a periphery portion of a penetrated portion 17 dose to the passage-forming layer 40 in the width direction, the penetrated portion 17 being formed by etching the passage-forming substrate 10 via the open portion 56, needs to be more inside than the periphery portion of the passage-forming layer 40 that consists of boron-doped polysilicon.

Note that the length of the opening portion 56 in the longitudinal direction is preferably set such that the periphery portion of the side surface of the penetrated portion 17 in the longitudinal direction, which is dose to the passage-forming layer 40, is made approximately coincident with the outer periphery of the space portion 41.

Then, after termination of the film-forming process, the protective film 91 is formed on the surface of the piezoelectric element 300 (see FIG. 5(*a*)). Subsequently, the passage-forming substrate 10 and the passage-forming layer 40 are subjected to anisotropic etching with the patterned silicon dioxide layer 55 as a mask to form the pressure generating chamber 11.

Figure 12A:
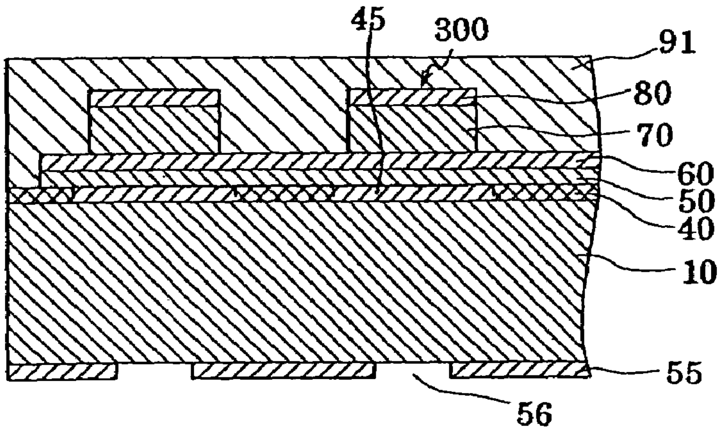
FIGS. 12(*a*) to 12(*c*) are cross-sectional views showing a manufacturing process of the ink-jet recording head according to embodiment 4 of the present invention.
Figure 12B:
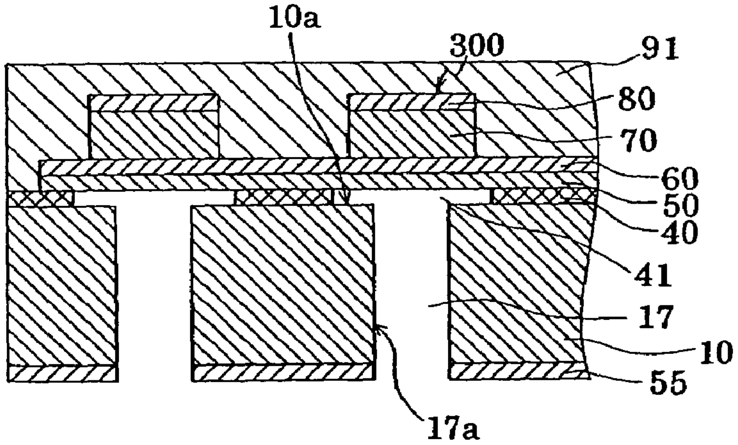
Figure 12C:
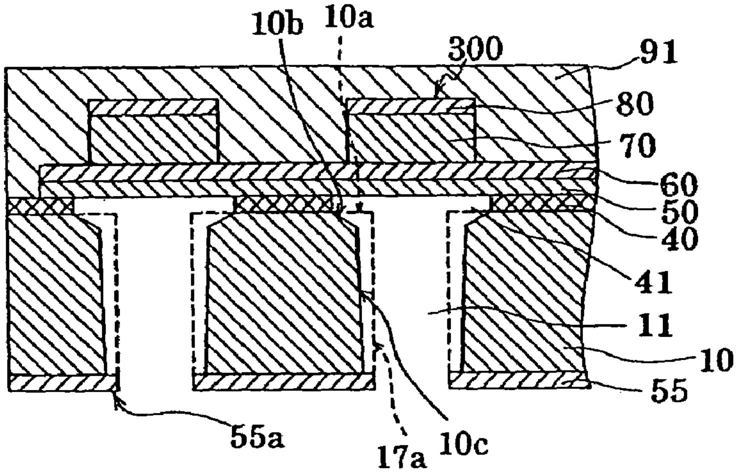

Specifically, as shown in FIG. 12(*a*), firstly, etching is performed for the passage-forming substrate 10 from the etched open portion 56 of the silicon dioxide layer 55 until the etching reaches the passage-forming layer 40, thus the penetrated portion 17 is formed in the region of the passage-forming layer 40 that will be the space portion 41, and etching is performed for the passage-forming layer 40 via the penetrated portion 17 to form the space portion 41.

Thereafter, as shown in FIG. 12(*b*), the passage-forming substrate 10 is further subjected to etching via the space portion 41 to form the pressure generating chamber 11. Specifically, as described above, since the periphery portion of the penetrated portion 17 in the width direction, which is dose to the passage-forming layer 40, is located more inside than the periphery portion of the passage-forming layer 40, the plane (110) 10*a* of the passage-forming substrate 10, which is dose to the vibration plate, is exposed by forming the space portion 41. Accordingly, when etching further proceeds after forming the space portion 41, the passage-forming substrate 10 is eroded from the surface 10*a* dose to the vibration plate toward the silicon dioxide layer 55 with the passage-forming layer 40 as a mask, and the slanted surface 10*b* as a plane (111) is exposed, then etching stops. In this case, the passage-forming substrate 10 is etched also from an edge surface 17*a* of the penetrated portion 17 in the width direction to some extent to make itself a slanted surface 10*c*. An edge surface of the pressure generating chamber 11 in the width direction is constituted of the two slant surfaces 10*b* and 10*c* slanting from the outer periphery of the space portion 41 in the width direction to the inside of the pressure generating chamber.

Note that, although the silicon dioxide layer 55 is gradually removed when the passage-forming substrate 10 is etched, as shown in FIG. 12(*c*), resultantly a projection portion 55*a* projecting in the region opposite to the pressure generating chamber 11 sometimes remains since the etching rate is slow. The projection portion 55*a* may be left as it is, or may be finally removed.

In addition, after forming the pressure generating chamber 11 in such a manner, the protective film 91 covering the piezoelectric element 300 is removed (see FIG. 5(*c*)).

As described above, since the vibration region of the vibration plate is regulated by the outer periphery of the space portion 41 also in the present embodiment, when the passage-forming substrate 10 is etched to form the pressure generating chamber 11, a relative position between the pressure generating chamber 11 and the piezoelectric element 300, that is, a relative position between the vibration region of the vibration plate and the piezoelectric element 300 is determined regardless of an error such as variation of the vertical degree or the like. Accordingly, the ink ejection characteristics can be improved, and improvement of printing quality can be achieved.

In addition, since the edge surface of the pressure generating chamber 11 in the width direction is constituted of a slanted surface in the present embodiment, the depth of the space portion 41 is made substantially deep. Accordingly, filling the space portion 41 with ink is facilitated. Therefore, a printing defect such as dot omission or the like due to bubbles remaining in the space portion 41 can be prevented. Moreover, since the width of the compartment wall 13 between the pressure generating chambers 11 is gradually widened toward the nozzle orifice 21, a desired rigidity can be maintained to prevent cross talk.

Figure 13:
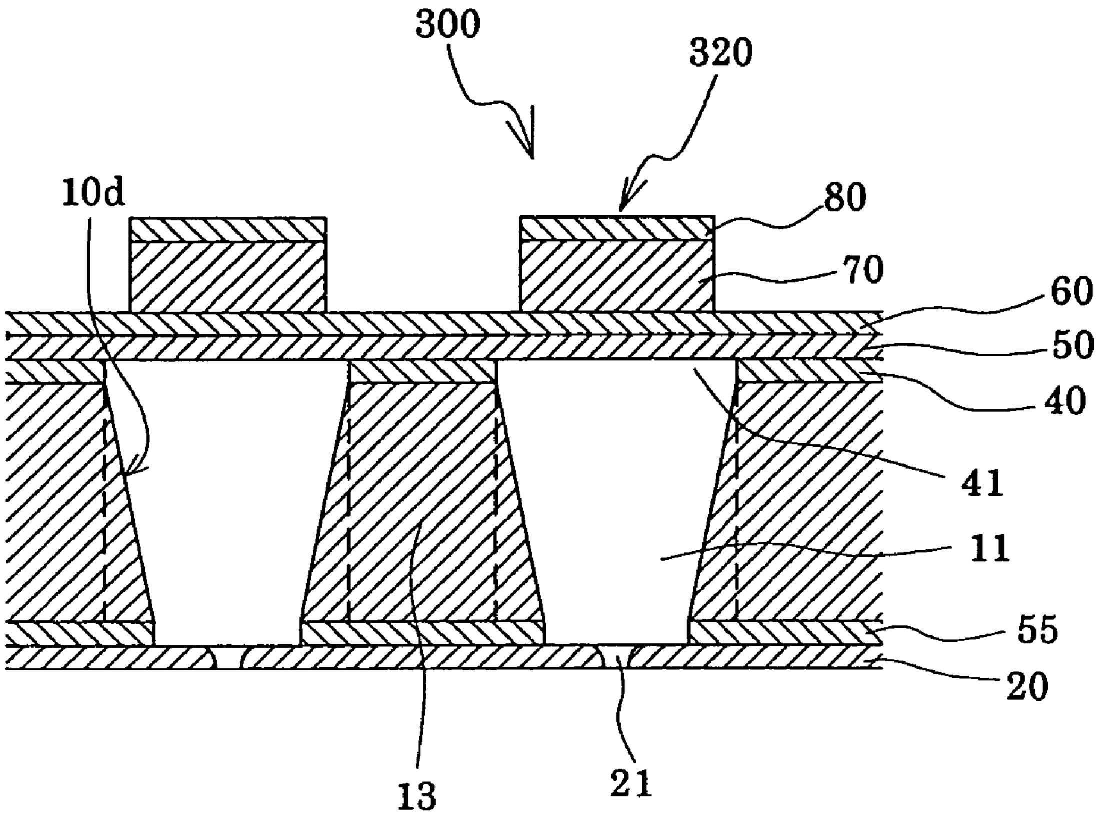
FIG. 13 is a cross-sectional view showing another example of the ink-jet recording head according to embodiment 4 of the present invention.

Note that the edge surface of the pressure generating chamber 11 in the width direction is constituted of the two slanted surfaces in the present embodiment. But not being limited to this, for example, as shown in FIG. 13, the edge surface in the width direction may be constituted of one slanted surface 10*d* slanting from the outer periphery of the space portion 41 to the inside of the pressure generating chamber. Such a slanted surface 10*d* is formed by further etching the penetrated portion 17 dose to the edge surface 17*a* in the width direction, where the etching is continued for the passage-forming substrate 10 even after the slanted surface 10*b* as a plane (111) is exposed when the etching is performed for the passage-forming substrate 10 from the surface 10*a* dose to the vibration plate (see FIGS. 12(*b*) and 12(*c*)). As a matter of course, also with such a constitution, a similar effect to that in the above-described embodiments is obtained.

(Other Embodiments)

Although the embodiments of the present invention have been described above, the fundamental constitution of the ink-jet recording head is not limited to the above-described embodiments, and change in the material, structure, or the like can be freely made.

For example in the above-described embodiments, although the reservoir 12 is formed together with the pressure generating chamber 11 in the passage-forming substrate 10, a member forming the reservoir may be provided in a superposing manner on the passage-forming substrate 10.

Figure 14:
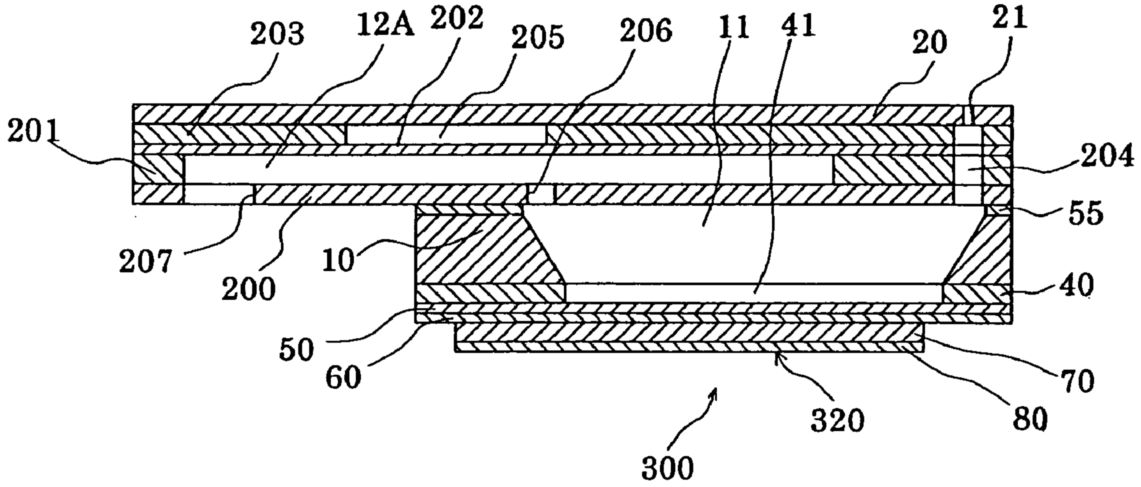
FIG. 14 is a cross-sectional view showing principal portions of the ink-jet recording head according to another embodiment of the present invention.

FIG. 14 shows a partial cross-section of the ink-jet recording head constituted in such a manner. In this embodiment, a sealing plate 200, a common ink-chamber forming plate 201, a thin plate 202 and an ink-chamber side plate 203 are sandwiched between the nozzle plate 20 having the nozzle orifice 21 drilled therein and the passage-forming substrate 10. And a nozzle communicating port 204 that communicates with the pressure generating chamber 11 and the nozzle orifice 21 is disposed so as to penetrate these plates. Specifically, a reservoir 12A is defined by the sealing plate 200, the common ink-chamber forming plate 201 and the thin plate 202, and each pressure generating chamber 11 and the reservoir 12A are made to communicate with each other via an ink communicating hole 206 drilled in the sealing plate 200. In addition, an ink introducing hole 207 for introducing ink from the outside to reservoir 12A is also drilled in the sealing plate 200. Moreover, in the ink-chamber side plate 203 located between the thin plate 202 and the nozzle plate 20, a penetrated portion 205 is formed at a position opposite to reservoir 12A in order to allow the thin plate 202 to absorb pressure generated at the time of ejecting ink droplets and directed oppositely to the nozzle orifice 21. Thus, application of unnecessary positive or negative pressures to the other pressure generating chambers by way of reservoir 12A can be prevented. Note that the thin plate 202 and the common ink-chamber forming plate 201 may be integrally formed.

As described above, the present invention can be applied to the ink-jet recording heads constituted in various ways as long as such application does not contradict the object of the present invention.

Figure 15:
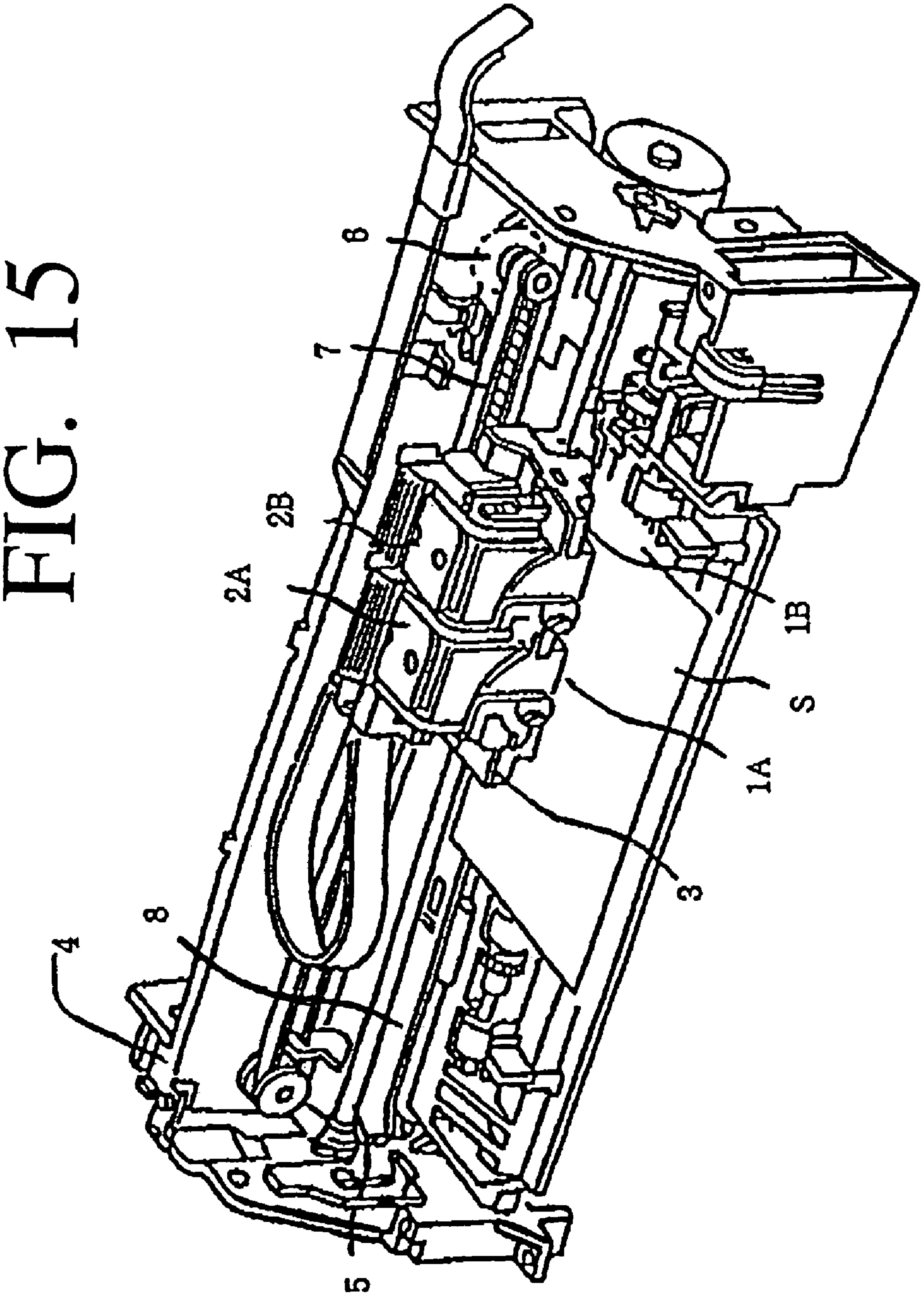
FIG. 15 is a perspective view schematically showing an ink-jet recording apparatus according to one embodiment of the present invention.

In addition, the ink-jet recording heads of the above-described embodiments constitute a portion of a recording head unit comprising an ink passage communicating with an ink cartridge or the like, and are mounted on an ink-jet recording apparatus. FIG. 15 is a schematic view showing one example of the ink-jet recording apparatus.

As shown in FIG. 15, in recording head units 1A and 1B, which have the ink-jet recording heads, cartridges 2A and 2B, which constitute ink supplying means, are provided detachably. A carriage 3 having the recording head units 1A and 1B mounted thereon is provided on a carriage shaft 5 attached on an apparatus body 4 so as to be freely movable in the shaft direction. Each of the recording head units 1A and 1B, for example, are to eject a black ink composition and a color ink, composition.

The drive force of the drive motor 6 is transmitted to the carriage 3 via a plurality of gears (not shown) and a timing belt 7 to move the carriage 3 that mounts the recording head units 1A and 1B along the carriage shaft 5. On the other hand, a platen 8 is provided to the apparatus body 4 along the carriage shaft 5, and a recording sheet S that is a recording medium such as paper fed by a paper feeding roller (not shown) or the like is rolled and caught by the platen 8 to be conveyed.

As described above, in the present invention, since the space portion is provided in the region opposite the pressure generating chamber, which is between the passage-forming substrate and the vibration plate, and the width of the pressure generating chamber is set to be equal to the width of the space portion or less, the vibration region of the vibration plate is regulated by the space portion, and the relative positionally accuracy thereof with the piezoelectric element is improved, thus the ink ejection characteristic and the stability thereof can be improved.

In addition, since the width of the pressure generating chamber can be made relatively narrow, the compartment wall can be made thick to increase the rigidity, thus cross talk between the pressure generating chambers adjacent to each other can be prevented.

Although the preferred embodiments of the present invention have been described in detail, it should be understood that various changes, substitutions and alternations can be made therein without departing from the spirit and scope of the invention as defined by the appended claims.

What is claimed is:

1. A manufacturing method for an ink-jet recording head, which comprises: a passage-forming substrate having a pressure generating chamber formed thereon, which communicates with a nozzle orifice; and a piezoelectric element formed of a thin film and by a lithography method in a region corresponding to said pressure generating chamber via a vibration plate constituting a portion of said pressure generating chamber, in which a passage-forming layer is provided between said passage-forming substrate and said vibration plate, and the passage-forming layer has a space portion formed in a region opposite to said pressure generating chamber, the manufacturing method of an ink-jet recording head comprising:

forming said passage-forming layer on said passage-forming substrate and imparting etching selectivity to a region that will be said space portion of the passage-forming layer, forming said vibration plate on said passage-forming layer and forming a piezoelectric element on the vibration plate, performing anisotropic etching for said passage-forming substrate from a surface opposite that having said passage-forming layer to form a penetrated portion at least to a region that will be said space portion of said passage-forming layer, etching said passage-forming layer to form said space portion, and forming the pressure generating chamber opposite the space portion, joining a nozzle plate, having nozzle orifices, to the passage-forming substrate, and thereby forming the ink-jet recording head.

2. The manufacturing method of an ink-jet recording head according to claim 1, wherein said passage-forming layer comprises polysilicon, and etching selectivity is imparted by doping boron onto a region other than the region that will be said space portion.

3. A manufacturing method of an ink-jet recording head, which comprises: a passage-forming substrate having a pressure generating chamber formed therein, which communicates with a nozzle orifice; and a piezoelectric element formed of a thin film and by a lithography method in a region corresponding to said pressure generating chamber via a vibration plate constituting a portion of said pressure generating chamber, in which a passage-forming layer that comprises boron-doped polysilicon is provided between said passage-forming layer has a space portion formed in a region opposite said pressure generating chamber, the manufacturing method of an ink-jet recording head comprising:

forming a polysilicon layer on said passage-forming substrate;

doping boron onto a region other than a region in which said space portion of the polysilicon layer is formed to make said passage-forming layer;

forming said vibration plate on said passage-forming layer and forming the piezoelectric element on the vibration plate;

etching said passage-forming substrate from a surface opposite that having said passage-forming layer to form said pressure generating chamber;

etching entirely the region of said polysilicon layer other than the region having boron doped thereon from said pressure generating chamber to form said space portion;

joining a nozzle plate, having nozzle orifices, to the passage-forming substrate, and thereby forming the ink-jet recording head.

4. The manufacturing method of an ink-jet recording head according to claim 3, wherein the step of forming said pressure generating chamber and the step of forming said space portion are continuously performed.

* * * * *